United States Patent
Theuss

(10) Patent No.: US 11,519,847 B2
(45) Date of Patent: Dec. 6, 2022

(54) METHODS INCLUDING PANEL BONDING ACTS AND ELECTRONIC DEVICES INCLUDING CAVITIES

(71) Applicant: Infineon Technologies AG, Neubiberg (DE)

(72) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 264 days.

(21) Appl. No.: 16/778,692

(22) Filed: Jan. 31, 2020

(65) Prior Publication Data
US 2020/0249149 A1 Aug. 6, 2020

(30) Foreign Application Priority Data
Feb. 5, 2019 (DE) ...................... 10 2019 102 836.1

(51) Int. Cl.
| | | |
|---|---|---|
| *G01N 21/17* | (2006.01) | |
| *G01N 29/24* | (2006.01) | |
| *G01R 33/028* | (2006.01) | |
| *B81C 1/00* | (2006.01) | |

(52) U.S. Cl.
CPC ...... *G01N 21/1702* (2013.01); *B81C 1/00119* (2013.01); *G01N 29/2418* (2013.01); *G01R 33/0286* (2013.01); *B81C 2203/0118* (2013.01); *B81C 2203/035* (2013.01); *G01N 2021/1704* (2013.01); *G01N 2291/021* (2013.01)

(58) Field of Classification Search
CPC ....... G01N 21/1702; G01N 2021/1704; G01N 29/2418; G01N 2291/021; G01R 33/0286; B81C 1/00119; B81C 1/00293; B81C 1/00277; B81C 2203/0118; B81C 2203/035; B81B 7/02; B81B 7/0035; B81B 7/0054
See application file for complete search history.

(56) References Cited

U.S. PATENT DOCUMENTS

| | | | |
|---|---|---|---|
| 8,748,998 B2 | 6/2014 | Frey et al. | |
| 10,365,208 B2 | 7/2019 | Kolb et al. | |
| 10,495,612 B2 | 12/2019 | Dehe et al. | |
| 2006/0210234 A1* | 9/2006 | Shiv | ...................... H01L 23/481 385/147 |
| 2009/0283844 A1 | 11/2009 | Sparks | |

(Continued)

FOREIGN PATENT DOCUMENTS

| | | |
|---|---|---|
| DE | 10 2010 039 057 | 2/2012 |
| DE | 10 2013 208 814 | 11/2014 |

(Continued)

*Primary Examiner* — Suman K Nath
(74) *Attorney, Agent, or Firm* — Dicke, Billig & Czaja, PLLC

(57) ABSTRACT

A method is disclosed. In one example, the method includes bonding a first panel of a first material to a base panel in a first gas atmosphere, wherein multiple hermetically sealed first cavities encapsulating gas of the first gas atmosphere are formed between the first panel and the base panel. The method further includes bonding a second panel of a second material to at least one of the base panel and the first panel, wherein multiple second cavities are formed between the second panel and the at least one of the base panel and the first panel.

13 Claims, 8 Drawing Sheets

(56) References Cited

U.S. PATENT DOCUMENTS

| | | | |
|---|---|---|---|
| 2015/0211949 A1* | 7/2015 | Fujita | B81C 1/00047 |
| | | | 73/718 |
| 2015/0266720 A1* | 9/2015 | Furuhata | B81B 7/007 |
| | | | 257/415 |
| 2016/0084865 A1 | 3/2016 | Kaelberer et al. | |
| 2017/0343419 A1 | 11/2017 | Hopper et al. | |

FOREIGN PATENT DOCUMENTS

| | | |
|---|---|---|
| DE | 10 2014 114 672 | 4/2015 |
| DE | 10 2016 205 024 | 9/2016 |
| EP | 3 401 273 | 11/2018 |

\* cited by examiner

METHODS INCLUDING PANEL BONDING ACTS AND ELECTRONIC DEVICES INCLUDING CAVITIES

CROSS-REFERENCE TO RELATED APPLICATION

This Utility Patent Application claims priority to German Patent Application No. 10 2019 102 836.1, filed Feb. 5, 2019, which is incorporated herein by reference.

TECHNICAL FIELD

The present disclosure generally relates to electronic devices and methods for manufacturing thereof. In particular, the present disclosure relates to methods including panel bonding acts and electronic devices including cavities manufactured by such methods.

BACKGROUND

Electronic devices may include cavities housing electrical components of the devices. For example, moving parts of microelectromechanical systems (MEMS) may be arranged in cavities to ensure mechanical functionality of the moving parts. The cavities may be connected to the environment via holes or channels for an exchange of fluids or gases. Manufacturers of electronic devices are constantly striving to improve their products and methods for manufacturing thereof. It may thus be desirable to develop methods for manufacturing electronic devices that provide an improved and cost-efficient production of the devices and that may be particularly suited for the production of MEMS.

SUMMARY

An aspect of the present disclosure relates to a method. The method comprises bonding a first panel of a first material to a base panel in a first gas atmosphere, wherein multiple hermetically sealed first cavities encapsulating gas of the first gas atmosphere are formed between the first panel and the base panel. The method further comprises bonding a second panel of a second material to at least one of the base panel and the first panel, wherein multiple second cavities are formed between the second panel and the at least one of the base panel and the first panel.

A further aspect of the present disclosure relates to a method. The method comprises bonding a first panel of a first airtight material to a base panel in a first gas atmosphere, wherein multiple hermetically sealed first cavities encapsulating gas of the first gas atmosphere are formed between the first panel and the base panel. The method further comprises bonding multiple caps of a second airtight material to at least one of the base panel and the first panel in a second gas atmosphere different from the first gas atmosphere, wherein multiple hermetically sealed second cavities encapsulating gas of the second gas atmosphere are formed between the multiple caps and the at least one of the base panel and the first panel.

A further aspect of the present disclosure relates to a device. The device comprises a first cavity formed by a first cap of an airtight material bonded to a base, wherein the first cavity hermetically seals a first gas and encapsulates a first electronic component. The device further comprises a second cavity formed by a second cap of an airtight material bonded to the base, wherein the second cavity hermetically seals a second gas different from the first gas and encapsulates a second electronic component.

BRIEF DESCRIPTION OF THE DRAWINGS

The accompanying drawings are included to provide a further understanding of aspects and are incorporated in and constitute a part of this description. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1A:
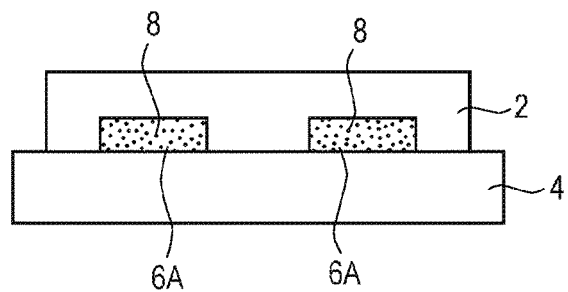
FIG. 1 includes FIGS. 1A and 1B schematically illustrating a cross-sectional side view of a method for manufacturing a device in accordance with the disclosure.
Figure 1B:
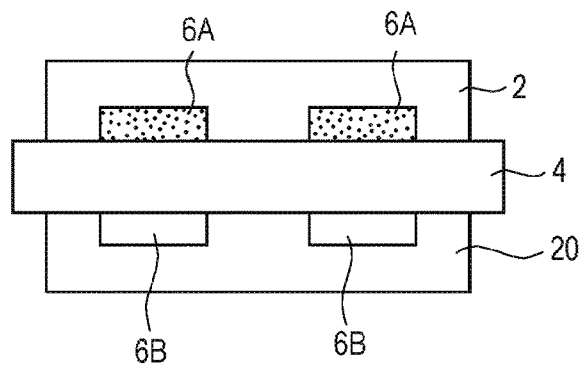

FIG. 1 includes FIGS. 1A and 1B schematically illustrating a cross-sectional side view of a method for manufacturing a device in accordance with the disclosure. The method of FIG. 1 is illustrated in a general manner in order to qualitatively specify aspects of the disclosure. The method may include further aspects which are not illustrated for the sake of simplicity. For example, the method may be extended by any of the aspects described in connection with other methods and devices in accordance with the disclosure.

In FIG. 1A, a first panel 2 of a first material is bonded to a base panel 4 in a first gas atmosphere. For the bonding act, the first panel 2 and the base panel 4 may be placed in a bonding chamber (not illustrated) configured to provide the first gas atmosphere. It is noted that herein the term "panel" may be used synonymously with the term "wafer". After the bonding act, multiple hermetically sealed first cavities 6A encapsulating gas 8 of the first gas atmosphere are formed between the first panel 2 and the base panel 4. In FIG. 1A, the encapsulated gas 8 is illustrated by dots. In the example of FIG. 1A, only two first cavities 6A are illustrated for the sake of simplicity. In further examples, the number of formed first cavities 6A may differ in an arbitrary manner. For example, the first panel 2 may be used for manufacturing several hundreds or thousands of MEMS devices, wherein each of the manufactured devices may include only one of the first cavities 6A. For example, at least one of the first cavities 6A may become a part of a photoacoustic gas sensor that is to be manufactured. In such case, an IR emitter and a protective gas may be enclosed in the first cavity 6A.

In FIG. 1B, a second panel 20 of a second material is bonded to at least one of the base panel 4 and the first panel 2. Multiple second cavities 6B are formed between the second panel 20 and the at least one of the base panel 4 and the first panel 2. In the example of FIG. 1B, the second panel 20 may be bonded to the base panel 4. A further example in which the second panel is bonded to the first panel instead of the base panel is shown and described in connection with FIG. 6.

According to an embodiment the second panel 20 may be bonded in a second gas atmosphere different from the first gas atmosphere. In addition, the second cavities 6B may be hermetically sealed and may encapsulate gas of the second gas atmosphere. For example, at least one of the second cavities 6B may become a part of a photoacoustic gas sensor that is to be manufactured. In such case, a microphone and a reference gas may be enclosed in the second cavity 6B. In an alternative embodiment, the second cavities 6B may not necessarily be hermetically sealed, but may be connected to the environment via one or more holes and/or channels arranged in the second panel 20.

According to an embodiment the bonded panels 2, 4 and 20 may be singulated into multiple devices to be manufactured. The singulation process may include an etching process, a plasma dicing process, an ultrasonic mechanical dicing process, a laser dicing process, or a combination thereof. Each of the devices may include at least two cavities, wherein a first cavity of the at least two cavities may include gas of the first gas atmosphere and a second cavity of the at least two cavities may include gas of the second gas atmosphere. For example, a manufactured device may be a photoacoustic gas sensor, wherein the first cavity may enclose an IR emitter and a protective gas and the second cavity may enclose a microphone and a reference gas.

According to an embodiment at least one of the first material and the second material may be airtight. That is, the respective material may be configured to exclude a passage of air, oxygen, or other gases. The airtight material may be configured to form hermetically sealed cavities in which electronic components may be safely arranged. The electronic components may thus be secured against external influences, such as e.g. humidity, so that a proper functioning and reliability of the electronic components may be ensured. In addition, certain electronic components, such as e.g. a microphone, may require cavities encapsulating a defined gas having a constant concentration.

According to an embodiment at least one of the first material and the second material may include at least one of a semiconductor material, a glass material, a ceramic material. In particular, these materials may be airtight. In one example, a glass material may form a panel which may be made of or may include at least one of quartz, fused silica, borosilicate glass, etc. In a further example, a ceramic material may form a panel which may be made of or may include at least one of an LTCC (Low Temperature Cofired Ceramics) multilayer ceramic material, a HTCC (High Temperature Cofired Ceramics) multilayer ceramic material, etc. In yet a further example, a semiconductor material may form a panel which may be made of or may include at least one an elemental semiconductor material, such as e.g. Si, and a compound semiconductor material, such as e.g. GaN, SiC, SiGe, GaAs. The panels 2, 4 and 20 may be made of a same material or of different materials depending on the type of the devices that are to be manufactured.

According to an embodiment at least one of the first panel 2 and the second panel 20 may include multiple recesses, may be bonded to a planar surface of the base panel 4, and the cavities formed between the base panel 4 and the at least one of the first panel 2 and the second panel 20 may be formed by sections of the planar surface and the recesses. In the example of FIG. 1, the first cavities 6A may be formed between recesses arranged in the lower surface of the first panel 2 and the upper planar surface of the base panel 4. In a further example, the first cavities 6A may be formed between recesses in the upper surface of the base panel 4 and a planar lower surface of the first panel 2 facing the base panel 4. In yet a further example, the first cavities 6A may be formed between recesses in the upper surface of the base panel 4 and recesses in the lower surface of the first panel 2. In such case, the recesses in the first panel 2 and the base panel 4 may be at least partly aligned to each other such that cavities may be formed by a recess in the first panel 2 and a recess in the base panel 4, respectively. Alternatively, the recesses in the first panel 2 and the base panel 4 may be displaced with respect to each other such that cavities may be formed only by a recess in the first panel 2 or only by a recess in the base panel 4. It is noted that above comments also hold true for the second cavities 6B formed between the base panel 4 and the second panel 20.

According to an embodiment the first panel 2 and the second panel 20 may be bonded to opposite surfaces of the base panel 4 as exemplarily shown in FIG. 1. Here, the first cavities 6A and the second cavities 6B arranged on opposite surfaces of the base panel 4 may be displaced or aligned to each other. Examples of electronic devices in accordance with the disclosure including cavities arranged on opposite sides of a base are shown and described in connection with FIGS. 3, 11 and 13.

According to an embodiment the first panel 2 and the second panel 20 may be bonded to a same surface of the base panel 4. Examples of methods in accordance with the disclosure including such act are shown and described in connection with FIGS. 4 and 5. An example of a device in accordance with the disclosure including cavities on a same side of a base is shown and described in connection with FIG. 12.

According to an embodiment the second panel 20 may be bonded to the first panel 2, and the second cavities 6B may be stacked over the first cavities 6A. An example of a method in accordance with the disclosure including such act is shown and described in connection with FIG. 6. Such method may e.g. be used for manufacturing MEMS devices having a vertical structure.

According to an embodiment at least one of bonding the first panel 2 and bonding the second panel 20 may include at least one of anodic bonding, soldering, gluing, metal-to-metal bonding. Anodic bonding may refer to a panel bonding technique for sealing glass to either silicon or metal without introducing an intermediate layer. Anodic bonding may be commonly used to seal glass to silicon wafers in electronics and microfluidics. In addition, other materials may be used for anodic bonding with silicon, for example LTCC. Soldering may e.g. refer to eutectic soldering (or eutectic bonding) which may relate to a panel bonding technique with an intermediate metal layer that can produce a eutectic system. For example, eutectic bonding may be used for Si—Si bonding or Si-glass bonding. Gluing may e.g. refer to adhesive bonding (or glue bonding) which may relate to a panel bonding technique including applying an intermediate layer to connect panels of different types of materials. An applied adhesive may be organic or inorganic, for example SU-8, benzocyclobutene (BCB), etc. Metal-to-metal bonding may refer to a panel bonding technique in which metal films may be used as bonding layers at panel-level. In particular, copper-to-copper bonding techniques may be used.

According to an embodiment material from the first panel 2 may be at least partially removed before bonding the second panel 20. For example, the first panel 2 and the second panel 20 may both be bonded to a same surface of the base panel 4. Before bonding the second panel 20, the bonded first panel 2 may substantially occupy the entire surface of the base panel 4. In order to provide surface area for bonding the second panel 20, parts of the first panel 2 may be removed. An exemplary act of removing material from a first panel before bonding a second panel is shown and described in connection with FIG. 4B. Removing material from the first panel 2 may e.g. include at least one of etching, dicing, chemical mechanical polishing, grinding, punching, stamping, etc.

According to an embodiment electronic components may be arranged over the base panel 4 before bonding the first panel 2 and bonding the second panel 20. At least one of the electronic components may be arranged in at least one of the first cavities 6A and the second cavities 6B after bonding the first panel 2 and bonding the second panel 20. Alternatively or additionally, the electronic components in the cavities 6A and 6B may have been arranged over at least one of the first panel 2 and the second panel 20 before the bonding act(s). In general, the electronic components may be any kind of electronic components that may be used in a MEMS device, a microfluidic device, a lab-on-a-chip device, etc. Such devices may inter alia include micromechanical elements, sensors, actuators, etc. A sensor (or sensor chip) may embed micromechanical structures and may further include electronic circuits configured to process electrical signals generated by the micromechanical structures. Alternatively or additionally, a logic (semiconductor) chip may be coupled to the sensor chip, wherein the logic chip may be configured to process electrical signals provided by the sensor chip. For example, the logic chip may include an application specific integrated circuit (ASIC). In one specific example, a photoacoustic gas sensor may include an IR emitter, a microphone, and an ASIC.

According to an embodiment the base panel 4 may be made of or may include a semiconductor material. The semiconductor material may be at least one of an elemental semiconductor material, such as e.g. Si, and a compound semiconductor material, such as e.g. GaN, SiC, SiGe, GaAs. The method of FIG. 1 may further include an act of integrating electronic components in the semiconductor material of the base panel 4 before bonding the first panel 2 and bonding the second panel 20. Again, the electronic components may be any kind of electronic components that may be used in a MEMS device, a microfluidic device, a lab-on-a-chip device, etc. At least one of the integrated electronic components may be arranged in at least one of the first cavities 6A and the second cavities 6B after bonding the first panel 2 and bonding the second panel 20. Alternatively or additionally, at least one of the first panel 2 and the second panel 20 may be made of or may include a semiconductor material, wherein the integrated electronic components arranged in the cavities may also be at least partly integrated in the semiconductor material of the first panel 2 and/or the second panel 20.

According to an embodiment at least one of the base panel 4, the first panel 2 and the second panel 20 may include one or more from a group consisting of: electrical through connections, conductor lines, electrical redistribution layers, optical connections, fluidic connections. An electrical through connection may e.g. be formed as a via connection, for example a Through Silicon Via (TSV). The electrical through connection may be part of a redistribution layer. A redistribution layer may include one or more layers of a ceramic or dielectric material. Structures for routing and redistributing electrical signals may be embedded in these layers. The signal routing structures may include vias and conductor lines. The conductor lines may be arranged in different planes between the ceramic or dielectric layers and may be electrically connected to each another via electrical through connections extending substantially vertically to the layers. For example, a redistribution layer may provide an electrical connection between electrical contacts arranged on opposite surfaces of a panel.

An optical connection may provide a path that allows a transmission of electromagnetic radiation through a material. It is noted that herein the term "optical" may generally refer to electromagnetic radiation of any wavelength. In particular, the electromagnetic radiation may be in the infrared (IR) range, but electromagnetic radiation of other wavelengths may be possible as well. For example, an optical connection may be provided by using a material which is transparent to the transmitted electromagnetic radiation. In one example, an optical connection for IR radiation may be provided by using an IR transparent silicon material. A fluidic connection may provide a path that allows a transmission of a fluid through a material. The fluid may e.g. be a gas or a liquid. For example, a fluidic connection may be provided by channels or holes extending through the material.

Figure 2A:
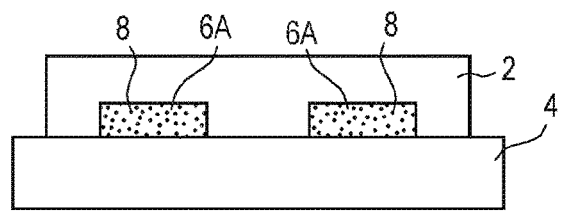
FIG. 2 includes FIGS. 2A and 2B schematically illustrating a cross-sectional side view of a method for manufacturing a device in accordance with the disclosure.
Figure 2B:
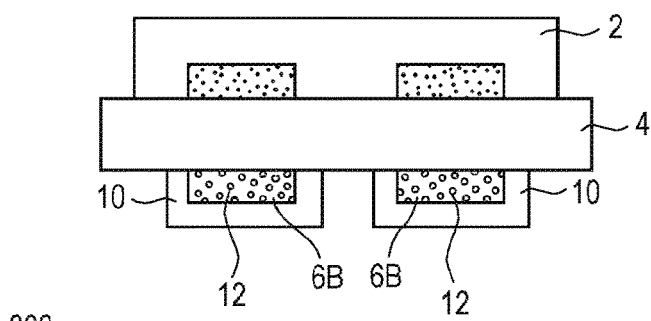

FIG. 2 includes FIGS. 2A and 2B schematically illustrating a cross-sectional side view of a method for manufacturing a device in accordance with the disclosure. The method of FIG. 2 is illustrated in a general manner in order to qualitatively specify aspects of the disclosure. The method may include further aspects which are not illustrated for the sake of simplicity. For example, the method may be extended by any of the aspects described in connection with other methods and devices in accordance with the disclosure. The method of FIG. 2 may be at least partly similar to the method of FIG. 1 such that comments in connection with FIG. 1 may also hold true for FIG. 2.

In FIG. 2A, a first panel 2 of a first airtight material is bonded to a base panel 4 in a first gas atmosphere. Multiple hermetically sealed first cavities 6A encapsulating gas 8 of the first gas atmosphere are formed between the first panel 2 and the base panel 4. The act of FIG. 2A may be similar to the act of FIG. 1A.

In FIG. 2B, multiple caps 10 of a second airtight material are bonded to at least one of the base panel 4 and the first panel 2 in a second gas atmosphere different from the first gas atmosphere. Multiple hermetically sealed second cavities 6B encapsulating gas 12 of the second gas atmosphere are formed between the multiple caps 10 and the at least one of the base panel 4 and the first panel 2. In FIG. 2B, the encapsulated gas 12 is illustrated by small circles. In the example of FIG. 2B, each of the second cavities 6B may be formed by one of the caps 10. In further examples, a cap 10 may be shaped in a way such that multiple second cavities 6B may be formed between the specific cap 10 and the base panel 4.

According to an embodiment an arrangement including the base panel 4, the first panel 2 and the multiple caps 10 may be singulated into multiple devices. Each of the devices may include at least two cavities, wherein a first cavity of the at least two cavities may include gas 8 of the first gas atmosphere and a second cavity of the at least two cavities may include gas 12 of the second gas atmosphere. In the example of FIG. 2B, the arrangement may e.g. be singulated along a vertical line extending between the first cavities 6A and the second cavities 6B, respectively.

Figure 3:
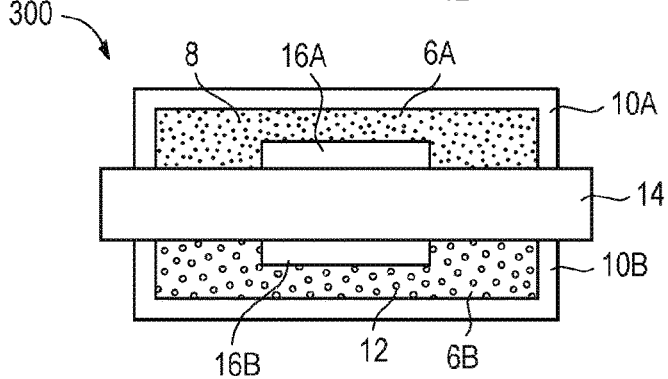
FIG. 3 schematically illustrates a cross-sectional side view of a device 300 in accordance with the disclosure.

FIG. 3 schematically illustrates a cross-sectional side view of a device 300 in accordance with the disclosure. The device 300 is illustrated in a general manner in order to qualitatively specify aspects of the disclosure. The device 300 may include further components which are not illustrated for the sake of simplicity. For example, the device 300 may be extended by any of the aspects described in connection with other devices and methods in accordance with the disclosure. In one example, the device 300 may be manufactured according to one of the methods of FIGS. 1 and 2.

The device 300 includes a first cavity 6A formed by a first cap 10A of an airtight material bonded to a base 14. The first cavity 6A hermetically seals a first gas 8 and encapsulates a first electronic component 16A. The device 300 further includes a second cavity 6B formed by a second cap 10B of an airtight material bonded to the base 14. The second cavity 6B hermetically seals a second gas 12 different from the first gas 8 and encapsulates a second electronic component 16B.

According to an embodiment the base 14 may include a semiconductor material and at least one of the first electronic component 16A and the second electronic component 16B may be integrated in the semiconductor material.

According to an embodiment the device 300 may include at least one of a MEMS, a microfluidic system, a lab-on-a-chip.

According to an embodiment the device 300 may include a photoacoustic gas sensor, wherein the first electronic component 16A may be or may include an IR emitter and the first gas 8 may be a protective gas. For example, the protective gas may be nitrogen or a noble gas, such as e.g. argon, xenon, krypton. In addition, the second electronic component 16B may be or may include a microphone, and the second gas 12 may be a reference gas. For example, the reference gas may be carbon dioxide, nitrogen oxide, methane, ammonia. The second electronic component 16B may further include an ASIC configured to process electrical signals provided by the microphone.

FIG. 4 includes FIGS. 4A to 4E schematically illustrating a cross-sectional side view of a method for manufacturing a device 400 in accordance with the disclosure. For example, the method of FIG. 4 may be seen as a more detailed implementation of the methods of FIGS. 1 and 2.

Figure 4A:
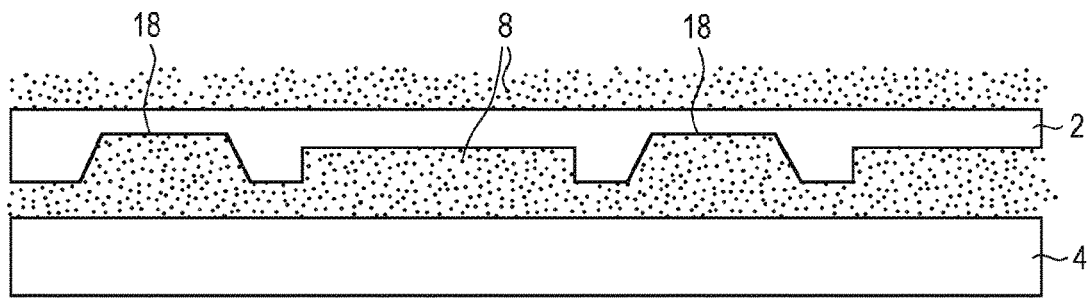
FIG. 4 includes FIGS. 4A to 4E schematically illustrating a cross-sectional side view of a method for manufacturing a device 400 in accordance with the disclosure.

In FIG. 4A, a first panel 2 may be bonded to a base panel 4 in a first gas atmosphere. For this purpose, the first panel 2 and the base panel 4 may be placed in a bonding chamber (not illustrated) configured to provide the first gas atmosphere. The bonding act may include at least one of anodic bonding, soldering, gluing, metal-to-metal bonding, depending on the materials of the first panel 2 and the base panel 4. Each of the first panel 2 and the base panel 4 may be made of an airtight material, such as e.g. at least one of a semiconductor material, a glass material, a ceramic material. The first panel 2 may include multiple recesses 18 formed in the lower surface of the first panel 2. The upper surface of the base panel 4 may be substantially planar. For example, the gas 8 of the first gas atmosphere may be a protective gas, e.g. nitrogen or a noble gas, such as argon, xenon, krypton.

Figure 4B:
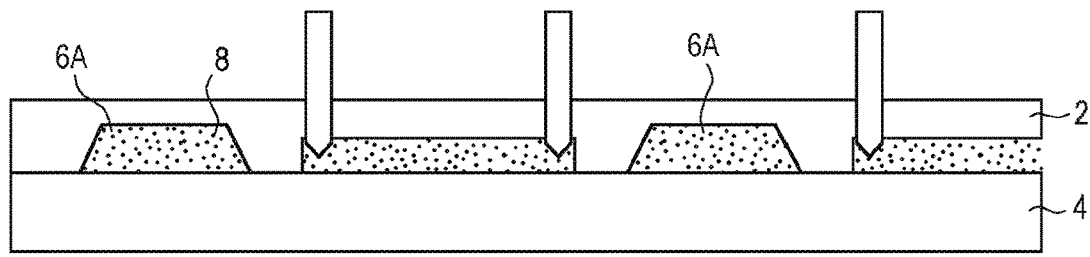

In FIG. 4B, multiple hermetically sealed first cavities 6A encapsulating the gas 8 of the first gas atmosphere may be formed between the first panel 2 and the base panel 4 after the bonding act. In a further act (see arrows), material of the first panel 2 arranged between the first cavities 6A may be removed. For example, the material may be removed by applying at least one of etching, dicing, punching, stamping, etc.

Figure 4C:
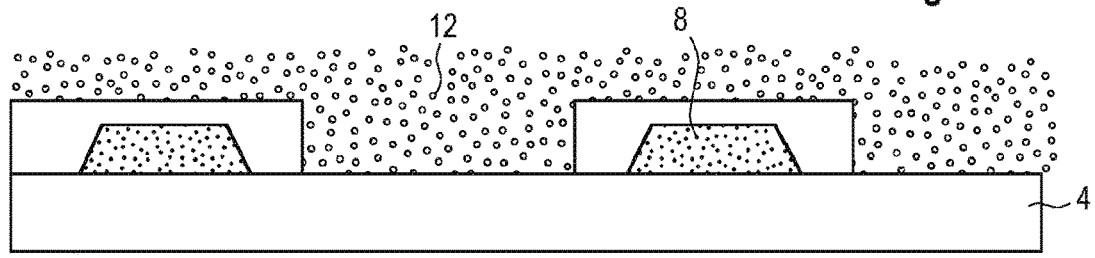

In FIG. 4C, the arrangement may be placed in a bonding chamber (not illustrated) providing a second gas atmosphere. The bonding chamber may be the same bonding chamber as used in the act of FIG. 4A or may differ therefrom. For example, the gas 12 of the second gas atmosphere may be a reference gas, such as e.g. carbon dioxide, nitrogen oxide, methane, ammonia.

Figure 4D:
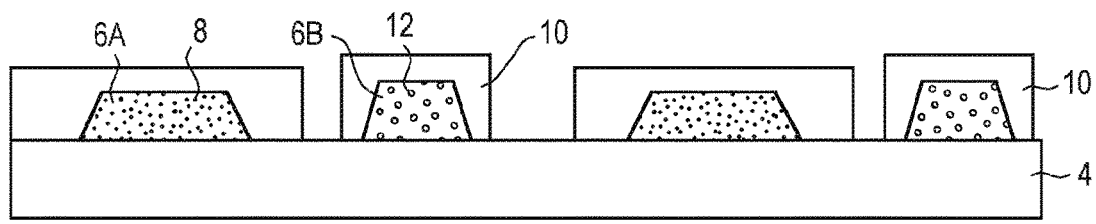

In FIG. 4D, multiple caps 10 may be bonded to the base panel 4. The caps 10 may be arranged between the first cavities 6A as exemplarily shown in FIG. 4D, but may also be placed elsewhere depending on the type of device to be manufactured. The caps 10 may be made of an airtight material, such as e.g. at least one of a semiconductor material, a glass material, a ceramic material. The bonding act may include at least one of anodic bonding, soldering, gluing, metal-to-metal bonding, depending on the materials of the base panel 4 and the caps 10. Multiple hermetically sealed cavities 6B encapsulating gas 12 of the second gas atmosphere may be formed between the base panel 4 and the caps 10 after the bonding act.

Figure 4E:
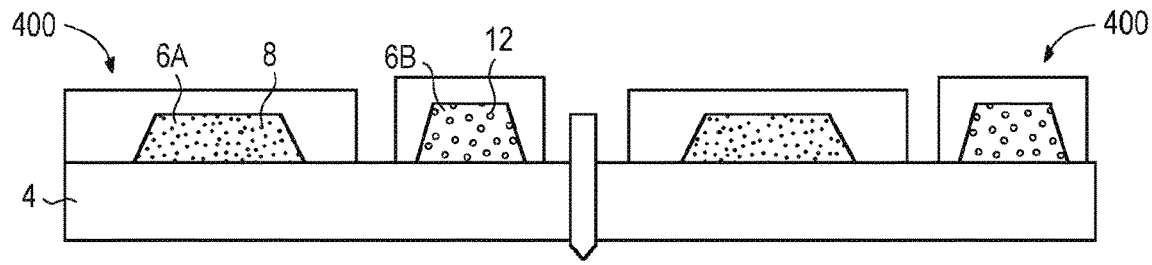

In FIG. 4E, the arrangement may be singulated into multiple devices 400 (see arrow). The singulation process may include an etching process, a plasma dicing process, an ultrasonic mechanical dicing process, a laser dicing process, or a combination thereof. Each of the devices 400 may include two cavities 6A and 6B. The first cavity 6A may include gas 8 of the first gas atmosphere, and the second cavity 6B may include gas 12 of the second gas atmosphere.

The method of FIG. 4 may include further acts which are not illustrated for the sake of simplicity. In one example, the method may include any further act required for manufacturing a device similar to the device 1200 of FIG. 12. In particular, a further exemplary act may include arranging electronic components in the cavities 6A and 6B.

In the example of FIG. 4, the first cavities 6A and the second cavities 6B may be hermetically sealed and filled with a defined gas, respectively. In further examples, at least one of the first cavities 6A and the second cavities 6B may include one or more holes, openings or channels providing one or more connections between the respective cavities and the environment. Examples of such devices are shown and described in connection with FIGS. 11 and 13.

FIG. 5 includes FIGS. 5A to 5E schematically illustrating a cross-sectional side view of a method for manufacturing a device 500 in accordance with the disclosure. The method of FIG. 5 may at least partly be similar to the method of FIG. 4 such that comments made in connection with FIG. 4 may also hold true for FIG. 5.

Figure 5A:
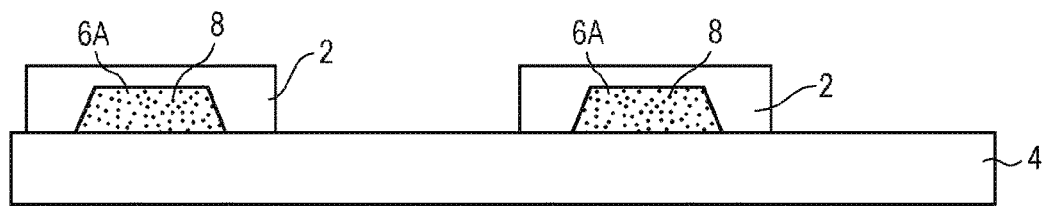
FIG. 5 includes FIGS. 5A to 5E schematically illustrating a cross-sectional side view of a method for manufacturing a device 500 in accordance with the disclosure.

In FIG. 5A, an arrangement including multiple hermetically sealed first cavities 6A between a first panel 2 and a base panel 4 may be provided. A first gas 8 may be encapsulated in the first cavities 6A. For example, the arrangement may be manufactured by acts similar to the acts of FIGS. 4A to 4B.

Figure 5B:
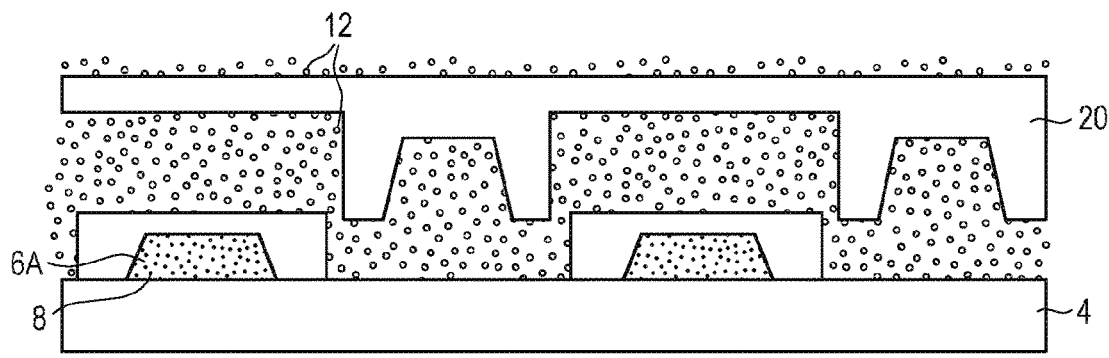

In FIG. 5B, a second panel 20 may be bonded to the base panel 4 in a second gas atmosphere.

Figure 5C:
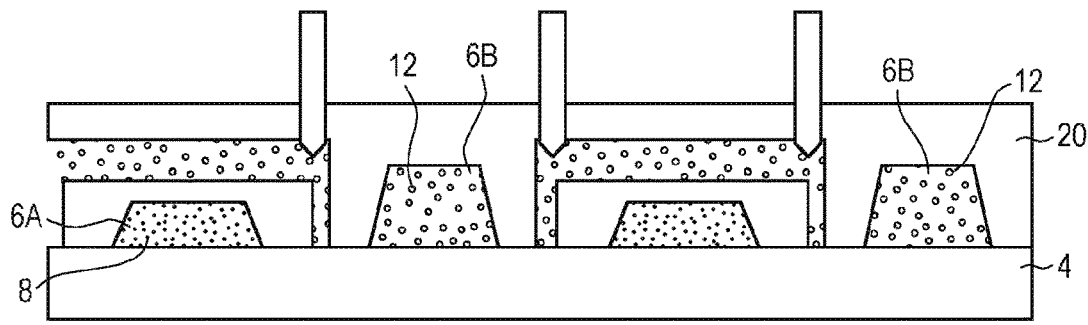

In FIG. 5C, multiple hermetically sealed second cavities 6B encapsulating gas 12 of the second gas atmosphere may be formed between the second panel 20 and the base panel 4 after the bonding act. In a further act (see arrows) similar to the act of FIG. 4B, material of the second panel 20 arranged between the second cavities 6B may be removed.

Figure 5D:
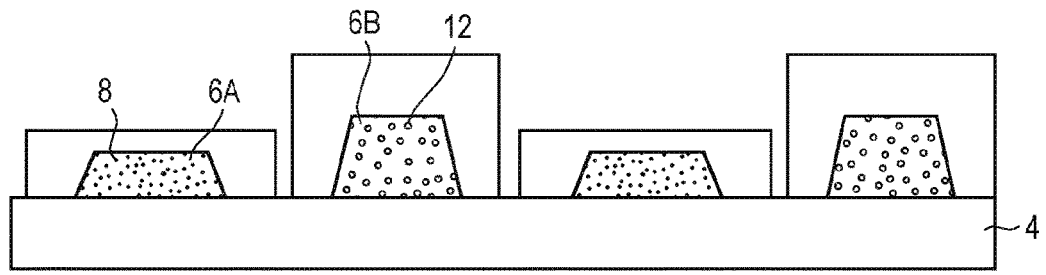

FIG. 5D shows the arrangement after removing the material of the second panel 20. The arrangement may include multiple first cavities 6A hermetically encapsulating the first gas 8 as well as multiple second cavities 6B hermetically encapsulating the second gas 12.

Figure 5E:
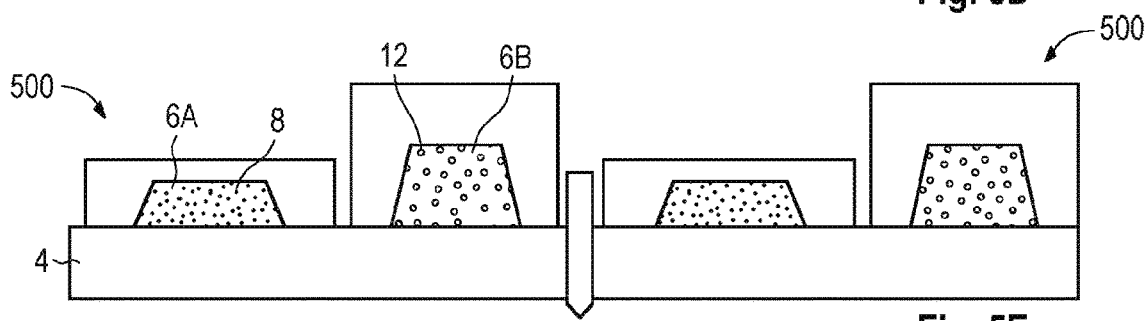

In FIG. 5E, the arrangement may be singulated into multiple devices 500 (see arrow). The singulation process of FIG. 5E may be similar to the singulation process of FIG. 4E.

FIG. 6 includes FIGS. 6A to 6D schematically illustrating a cross-sectional side view of a method for manufacturing a device 600 in accordance with the disclosure. The method of FIG. 6 may be at least partly similar to the methods of FIGS. 4 and 5.

Figure 6A:
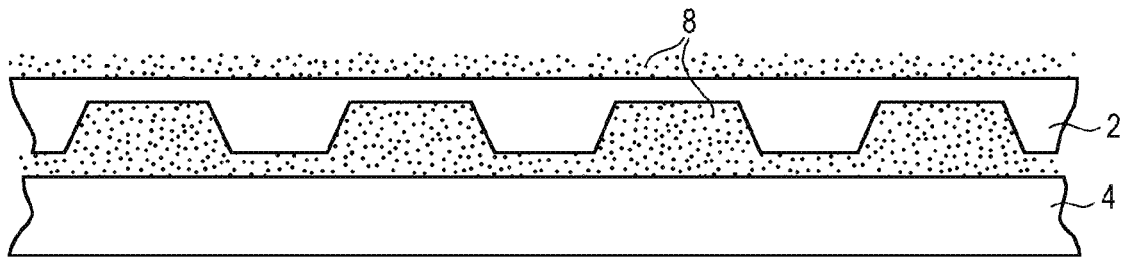
FIG. 6 includes FIGS. 6A to 6D schematically illustrating a cross-sectional side view of a method for manufacturing a device 600 in accordance with the disclosure.

In FIG. 6A, a first panel 2 may be bonded to a base panel 4 in a first gas atmosphere.

Figure 6B:
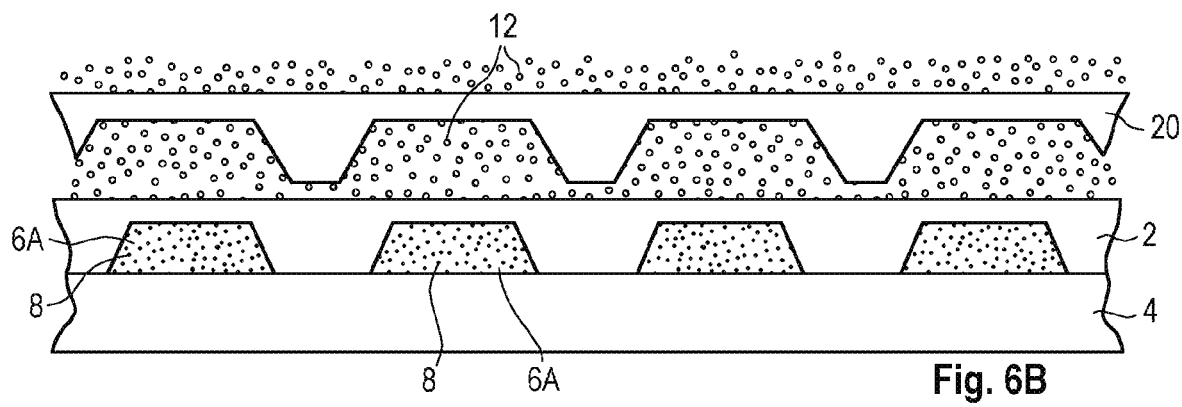

In FIG. 6B, multiple hermetically sealed first cavities 6A encapsulating gas 8 of the first gas atmosphere may be formed between the first panel 2 and the base panel 4 after the bonding act. In a further act, a second panel 20 may be bonded to the first panel 2 in a second gas atmosphere.

Figure 6C:
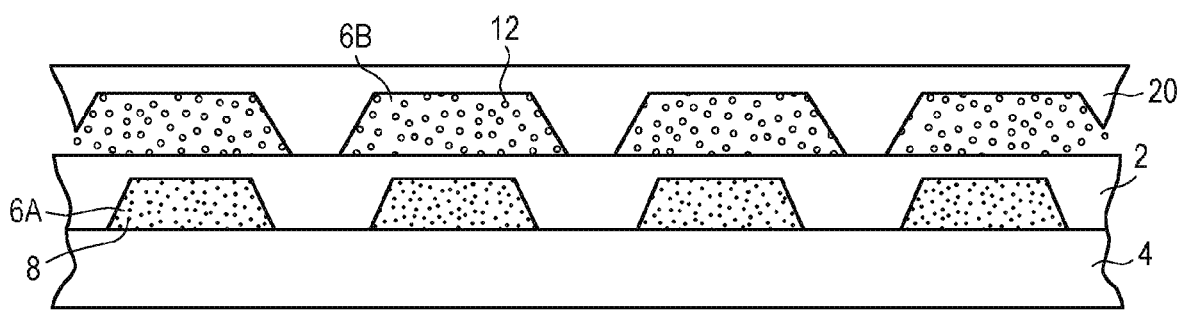

In FIG. 6C, multiple hermetically sealed second cavities 6B encapsulating gas 12 of the second gas atmosphere may be formed between the second panel 20 and the first panel 2 after the bonding act. As a result, the second cavities 6B may be stacked over the first cavities 6A. In particular, such arrangement of stacked cavities may be chosen when devices with a vertical structure are to be manufactured.

Figure 6D:
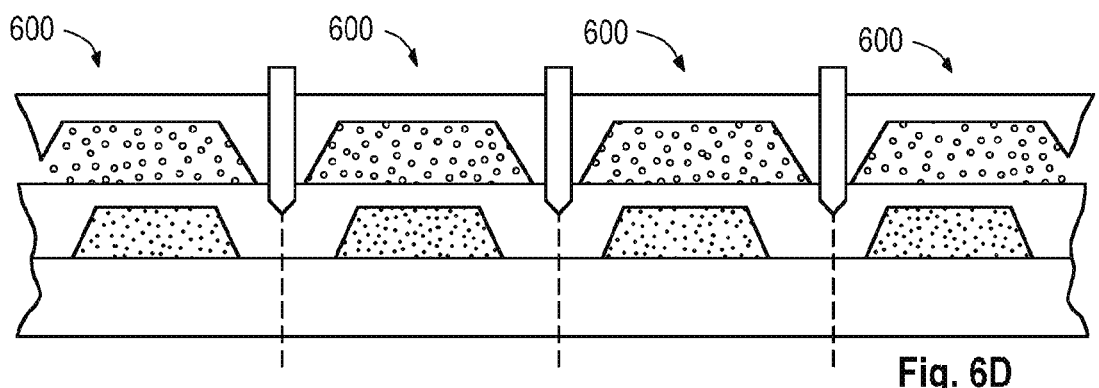

In FIG. 6D, the arrangement may be singulated into multiple devices 600 (see arrow). The singulation process of FIG. 6D may be similar to the singulation process of FIG. 4E.

Figure 7A:
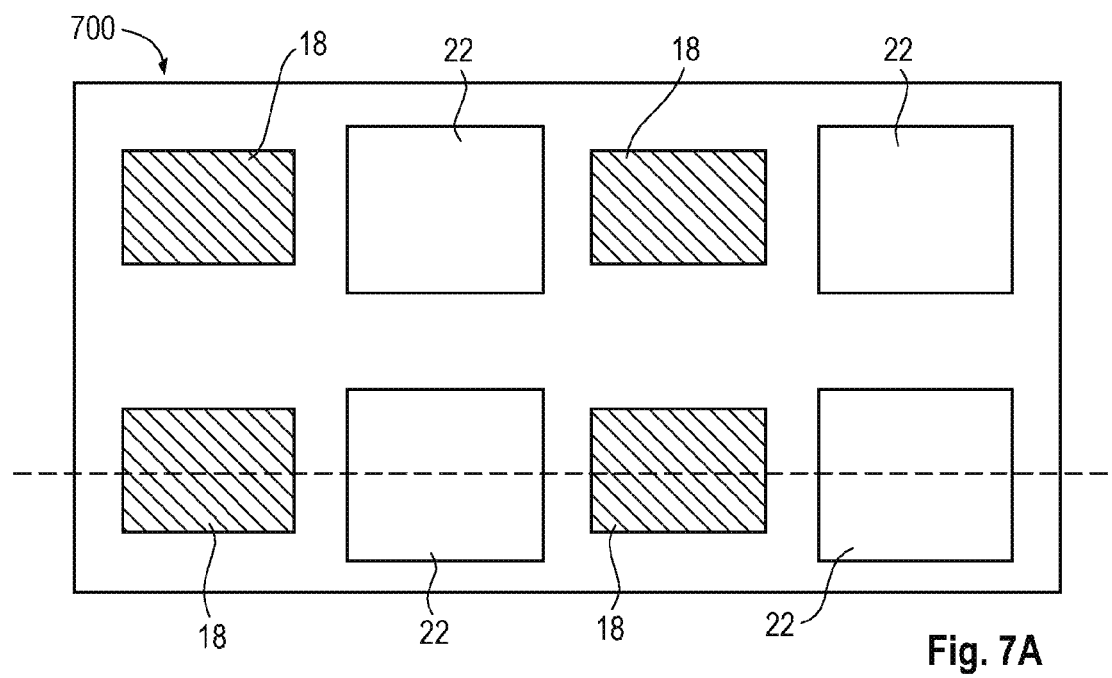
FIG. 7 includes FIGS. 7A and 7B schematically illustrating a top view and a cross-sectional side view of a panel 700, respectively, which may be used in a method in accordance with the disclosure.
Figure 7B:
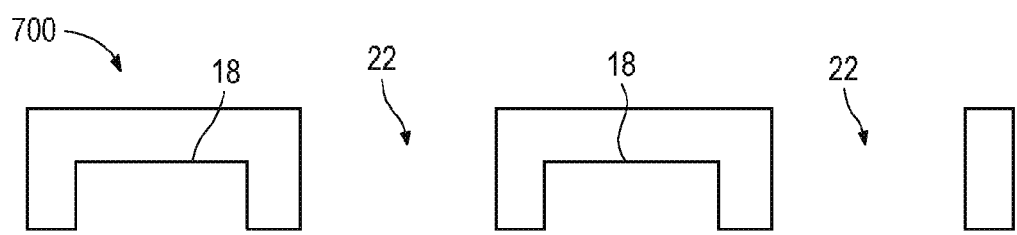

FIG. 7 includes FIGS. 7A and 7B schematically illustrating a panel 700 which may be used in a method in accordance with the disclosure. FIG. 7A shows a top view of the panel 700. FIG. 7B shows a cross-sectional side view of the panel 700 along a dashed line in the top view of FIG. 7A.

The panel 700 may include multiple recesses 18 and multiple openings 22. In the top view of FIG. 7A the recesses 18 are indicated by hatched areas, but may in reality be covered in such perspective. For illustrative purposes, FIG. 7 only shows a part or section of the panel 700. It is noted that the panel 700 may include an arbitrary number of further recesses 18 and further openings 20 which may be arranged in e.g. a rectangular and periodic grid structure when viewed in the top view. For example, the panel 700 may be used for manufacturing several hundreds or thousands of MEMS devices such that an corresponding number of recesses 18 and openings 20 may need to be provided. The panel 700 may be formed as a single-piece (or integral) part or may include multiple parts that may be joined together.

Figure 8:
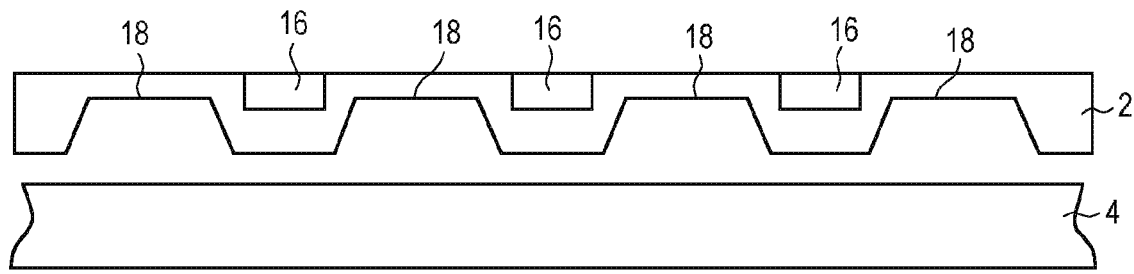
FIG. 8 schematically illustrates a cross-sectional side view of an act which may be applied in a method in accordance with the disclosure.
Figure 9:
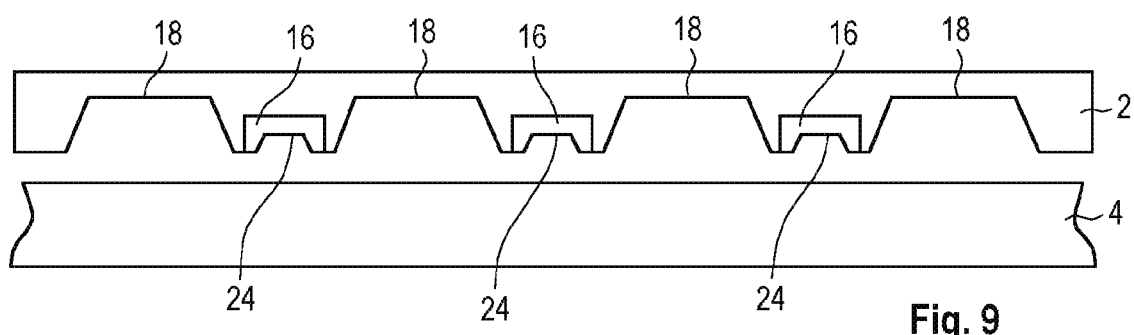
FIG. 9 schematically illustrates a cross-sectional side view of an act which may be applied in a method in accordance with the disclosure.
Figure 10:
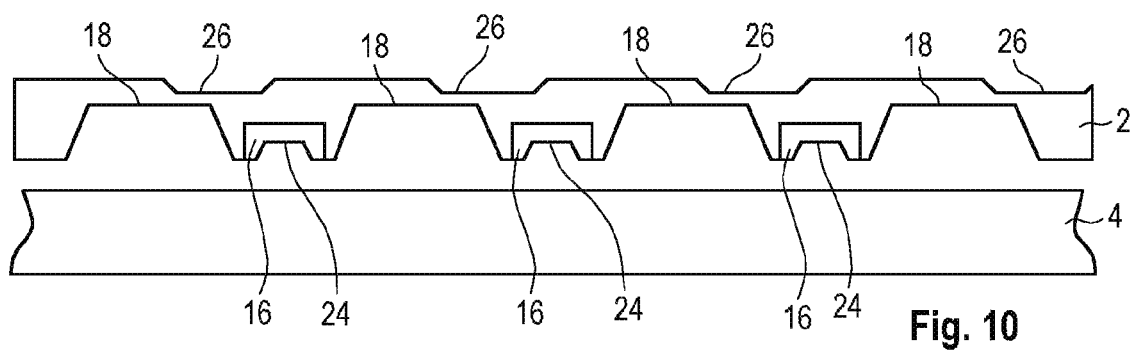
FIG. 10 schematically illustrates a cross-sectional side view of an act which may be applied in a method in accordance with the disclosure.

FIGS. 8 to 10 schematically illustrate cross-sectional side views of acts which may be applied in a method in accordance with the disclosure. For example, any of the acts of FIGS. 8 to 10 may be used in one of the previously specified methods.

In FIG. 8, a panel 2 may be bonded to a base panel 4 in order to form cavities that may particularly be hermetically sealed. In the example of FIG. 8, one or more of the cavities may be formed between recesses 18 in a lower surface of the panel 2 and a planar upper surface of the base panel 4. The panel 2 may be made of or may include a semiconductor material, for example an elemental semiconductor material, such as e.g. Si, or a compound semiconductor material, such as e.g. GaN, SiC, SiGe, GaAs. Multiple electronic components 16 may be integrated in the semiconductor material of the panel 2. In general, the location of the integrated electronic components 16 in the panel 2 may depend on the type of device that is to be manufactured. In the example of FIG. 8, the electronic components 16 may be located between the recesses 18 in the upper surface of the panel 2. Depending on the type of device that is to be manufactured, the electronic components 16 may be similar or differ from each other. In general, the electronic components 16 may be any kind of electronic component that may be used in a MEMS device, a microfluidic device, a lab-on-a-chip device, etc.

In contrast to FIG. 8, the electronic components 16 in FIG. 9 may be arranged between the recesses 18 in the lower surface of the panel 2. In addition, one or more of the electronic components 16 may include recesses 24 which may be arranged in a lower surface of the respective electronic component 16. When bonding the panel 2 to the base panel 4, additional cavities may be formed between the recesses 24 of the electronic components 16 and the upper surface of the base panel 4. For example, an electronic component 16 with a recess 24 may include a MEMS structure.

The act of FIG. 10 may at least partly be similar to the act of FIG. 9. In addition, the panel 2 may include further recesses 26 which may be arranged in the upper surface of the panel 2. For example, the recesses 26 may form additional cavities when a further panel (not illustrated) may be bonded to the upper surface of the panel 2.

Figure 11:
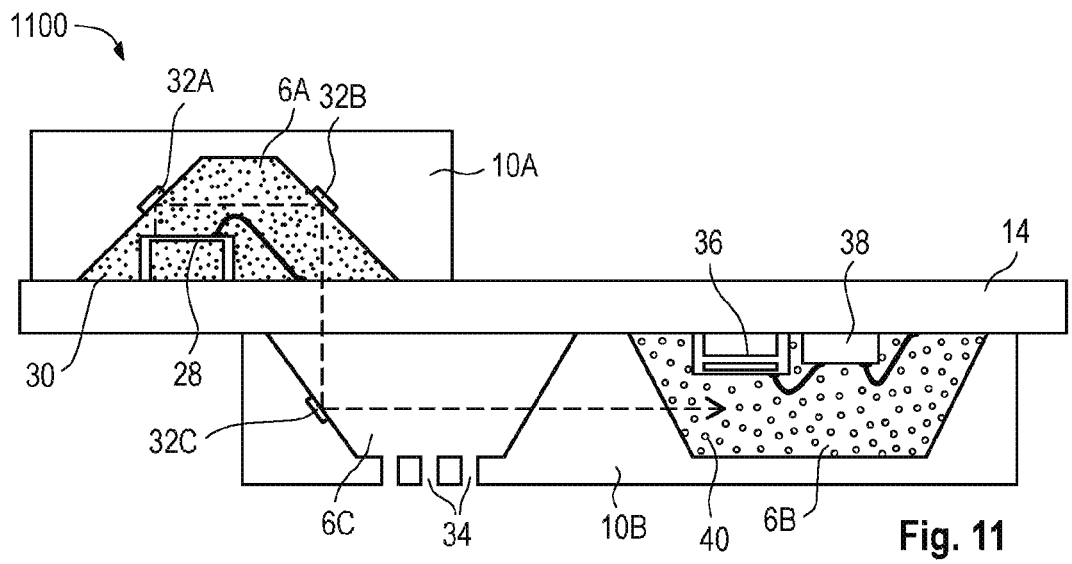
FIG. 11 schematically illustrates a cross-sectional side view of a device 1100 in accordance with the disclosure.

FIG. 11 schematically illustrates a cross-sectional side view of a device 1100 in accordance with the disclosure. For example, the device 1100 may be seen as a more detailed implementation of the device 300 of FIG. 3. The device 1100 may be manufactured by any of the previously described methods.

The device 1100 may include a base 14 with substantially planar upper and lower surfaces. A first cap 10A may be arranged over the upper surface of the base 14, thereby forming a hermetically sealed first cavity 6A. For example, the first cap 10A may be obtained by singulating a panel in an act during the fabrication of the device 1100. The first cap 10A may include one or more reflective structures 32A, 32B which may be arranged on the inner walls of the first cap 10A. In particular, the reflective structures 32A, 32B may be configured to reflect IR radiation. An IR emitter 28 may be mounted on the upper surface of the base 14 inside the first cavity 6A. The IR emitter 28 may be electrically coupled to electrical signal routing structures of the base 14. In addition, the first cavity 6A may be filled with a protective gas 30, for example nitrogen or a noble gas, such as e.g. argon, xenon, krypton.

A second cap 10B may be arranged over the lower surface of the base 14, thereby forming a second cavity 6B and a third cavity 6C. For example, the second cap 10B may be obtained by singulating a panel in an act during the fabrication of the device 1100. The second cavity 6B may be hermetically sealed while the third cavity 6C may be connected to the environment via one or more holes 34 arranged in the second cap 10B. A microphone 36 and an ASIC 38 may be mounted on the lower surface of the base 14 inside the second cavity 6B. The ASIC 38 may be configured to process electrical signals provided by the microphone 36. The microphone 36 and the ASIC 38 may be electrically coupled to electrical signal routing structures of the base 14. In addition, the second cavity 6B may be filled with a reference gas 40, such as e.g. carbon dioxide, nitrogen oxide, methane, ammonia. The second cap 10B may include one or more reflective structures 32C similar to the first cap 10A.

The device 1100 may be operated as a photoacoustic gas sensor for detecting and quantifying a certain gas or a certain gas component in the environment. In particular, the photoacoustic gas sensor may be configured to operate based on electromagnetic radiation in the IR range. However, similar photoacoustic gas sensors operating on the basis of electromagnetic radiation of other wavelengths may be possible as well. The reference gas 40 may serve as a reference for the certain gas that is to be detected. That is, the reference gas 40 may provide a relatively high concentration of the certain gas type. The IR emitter 28 may be configured to provide an IR pulse which may be a broadband pulse including wavelengths corresponding to excitation energies of the certain gas. The emitted IR pulse may propagate along a path (see dashed line), wherein the IR pulse may be reflected at the reflective structures 32A and 32B arranged on the inner walls of the first cap 10A and may further pass through the material (e.g. silicon) of the base 14. When propagating through the third cavity 6C, the IR pulse may at least partly be absorbed by portions of the certain gas, if present in the third cavity 6C (i.e. in the environment). The absorption may be specific for the certain gas, e.g. characteristic rotational or vibrational modes of atoms or molecules of the certain gas. The IR pulse may further propagate through the material (e.g. silicon) of the second cap 10B to the second cavity 6B and may be at least partly absorbed by the reference gas 40 and may provoke a local pressure increase in the reference gas 40 which may be sensed by the microphone 36. The signal sensed by the microphone 36 may be used for a detection and quantification of the certain gas in the environment.

Figure 12:
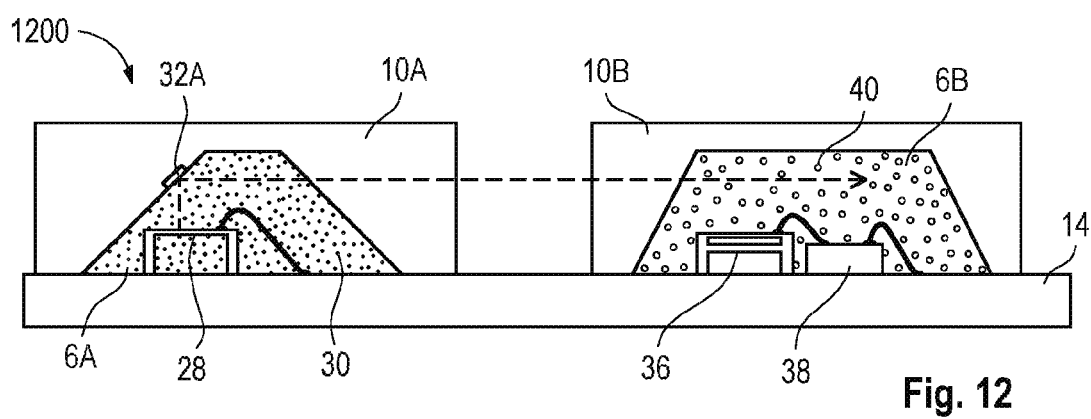
FIG. 12 schematically illustrates a cross-sectional side view of a device 1200 in accordance with the disclosure.

FIG. 12 schematically illustrates a cross-sectional side view of a device 1200 in accordance with the disclosure. The device 1200 may at least partly be similar to the device 1100 of FIG. 11. In contrast to FIG. 11, the first cap 10A and the second cap 10B may both be arranged on a same surface of the base 14. In a further contrast to FIG. 11, the first cap 10A may include only one reflective structure 32A arranged on the inner walls of the first cap 10A. In yet a further contrast to FIG. 11, the second cap 10B may include only the second cavity 6B encapsulating the reference gas 40, but may not necessarily include the third cavity 3C connected to the environment. In the example of FIG. 12, the IR pulse propagates through the environment (which may include possible portions of the certain gas that is to be detected) when passing a section located between the first cap 10A and the second cap 10B (see section of dashed line between caps 10A and 10B).

Figure 13:
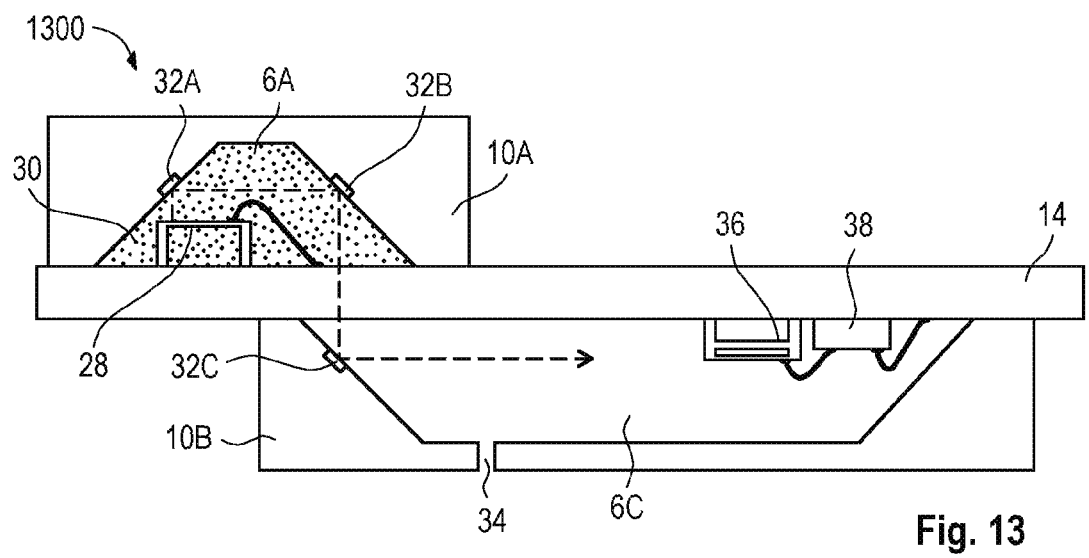
FIG. 13 schematically illustrates a cross-sectional side view of a device 1300 in accordance with the disclosure.

FIG. 13 schematically illustrates a cross-sectional side view of a device 1300 in accordance with the disclosure. The device 1300 may at least partly be similar to the device 1100 of FIG. 11. In contrast to FIG. 11, the second cap 10B may not necessarily form the second cavity 6B encapsulating the reference gas 40, but may only form the third cavity 6C connected to the environment via a hole 34. In the example of FIG. 13, the IR emitter 28 may be configured to emit an IR pulse which may only include wavelengths of interest corresponding to excitation energies of the certain gas that is to be detected. An additional filter (not illustrated) configured to filter the output of the IR emitter 28 may be used for providing a corresponding filtered IR pulse.

Figure 14:
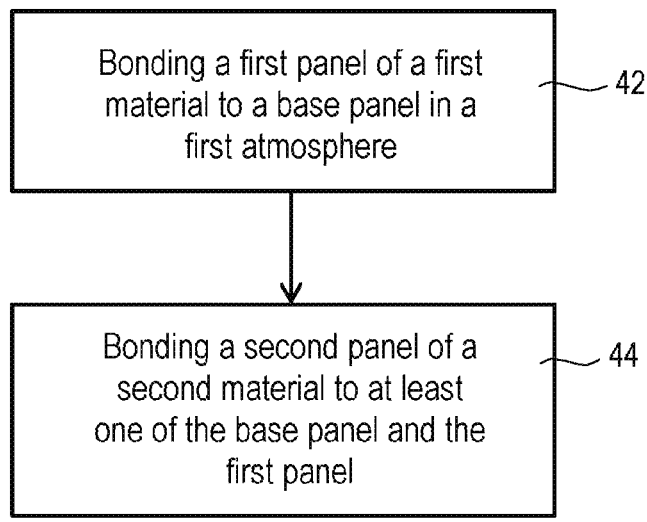
FIG. 14 illustrates a flowchart of a method in accordance with the disclosure.

FIG. 14 illustrates a flowchart of a method in accordance with the disclosure. The method may be similar to and may be read in connection with the method of FIG. 1.

At 42, a first panel of a first material is bonded to a base panel in a first gas atmosphere. Multiple hermetically sealed first cavities encapsulating gas of the first gas atmosphere are formed between the first panel and the base panel. At 44, a second panel of a second material is bonded to at least one of the base panel and the first panel. Multiple second cavities are formed between the second panel and the at least one of the base panel and the first panel.

Figure 15:
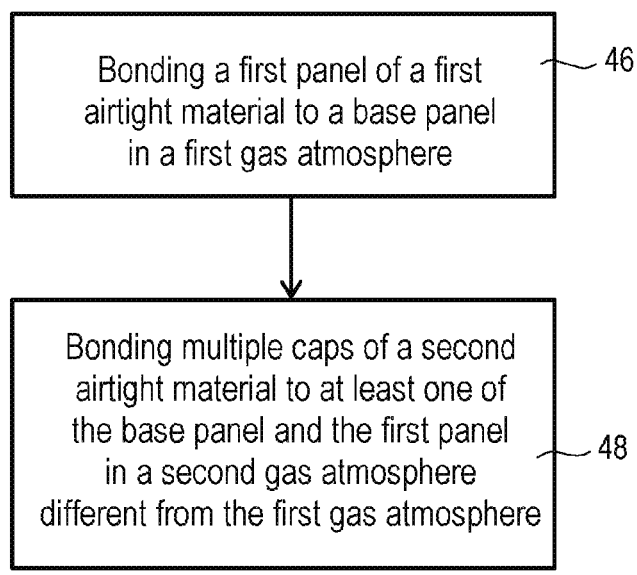
FIG. 15 illustrates a flowchart of a method in accordance with the disclosure.

FIG. 15 illustrates a flowchart of a method in accordance with the disclosure. The method may be similar to and may be read in connection with the method of FIG. 2.

At 46, a first panel of a first airtight material is bonded to a base panel in a first gas atmosphere. Multiple hermetically sealed first cavities encapsulating gas of the first gas atmosphere are formed between the first panel and the base panel. At 48, multiple caps of a second airtight material are bonded to at least one of the base panel and the first panel in a second gas atmosphere different from the first gas atmosphere. Multiple hermetically sealed second cavities encapsulating gas of the second gas atmosphere are formed between the multiple caps and the at least one of the base panel and the first panel.

EXAMPLES

In the following, methods including panel bonding acts and electronic devices including cavities will be explained by means of examples.

Example 1 is a method, comprising: bonding a first panel of a first material to a base panel in a first gas atmosphere, wherein multiple hermetically sealed first cavities encapsulating gas of the first gas atmosphere are formed between the first panel and the base panel; and bonding a second panel of a second material to at least one of the base panel and the first panel, wherein multiple second cavities are formed between the second panel and the at least one of the base panel and the first panel.

Example 2 is a method according to Example 1, wherein the second panel is bonded in a second gas atmosphere different from the first gas atmosphere, and the second cavities are hermetically sealed and encapsulate gas of the second gas atmosphere.

Example 3 is a method according to Example 2, further comprising: singulating the bonded panels into multiple devices, wherein each of the devices comprises at least two cavities, wherein a first cavity of the at least two cavities comprises gas of the first gas atmosphere and a second cavity of the at least two cavities comprises gas of the second gas atmosphere.

Example 4 is a method according to one of the preceding claims Examples, wherein at least one of the first material and the second material is airtight.

Example 5 is a method according to one of the preceding Examples, wherein at least one of the first material and the second material comprises at least one of a semiconductor material, a glass material, a ceramic material.

Example 6 is a method according to one of the preceding Examples, wherein at least one of the first panel and the second panel: comprises multiple recesses, is bonded to a planar surface of the base panel, and the cavities formed between the base panel and the at least one of the first panel and the second panel are formed by sections of the planar surface and the recesses.

Example 7 is a method according to one of the preceding Examples, wherein the first panel and the second panel are bonded to a same surface of the base panel.

Example 8 is a method according to one of Examples 1 to 6, wherein the first panel and the second panel are bonded to opposite surfaces of the base panel.

Example 9 is a method according to one of Examples 1 to 6, wherein the second panel is bonded to the first panel, and the second cavities are stacked over the first cavities.

Example 10 is a method according to one of the preceding Examples, wherein at least one of bonding the first panel and bonding the second panel comprises at least one of anodic bonding, soldering, gluing, metal-to-metal bonding.

Example 11 is a method according to one of the preceding Examples, further comprising: at least partially removing material from the first panel before bonding the second panel.

Example 12 is a method according to one of the preceding Examples, further comprising: arranging electronic components over the base panel before bonding the first panel and bonding the second panel, wherein at least one of the electronic components is arranged in at least one of the first cavities and the second cavities after bonding the first panel and bonding the second panel.

Example 13 is a method according to one of the preceding Examples, wherein the base panel comprises a semiconductor material and the method further comprises: integrating electronic components in the semiconductor material of the base panel before bonding the first panel and bonding the second panel, wherein at least one of the integrated electronic components is arranged in at least one of the first cavities and the second cavities after bonding the first panel and bonding the second panel.

Example 14 is a method according to one of the preceding Examples, wherein at least one of the base panel, the first panel and the second panel comprises one or more from a group consisting of: electrical through connections, conductor lines, electrical redistribution layers, optical connections, fluidic connections.

Example 15 is a method, comprising: bonding a first panel of a first airtight material to a base panel in a first gas atmosphere, wherein multiple hermetically sealed first cavities encapsulating gas of the first gas atmosphere are formed between the first panel and the base panel; and bonding multiple caps of a second airtight material to at least one of the base panel and the first panel in a second gas atmosphere different from the first gas atmosphere, wherein multiple hermetically sealed second cavities encapsulating gas of the second gas atmosphere are formed between the multiple caps and the at least one of the base panel and the first panel.

Example 16 is a method according to Example 15, further comprising: singulating an arrangement comprising the base panel, the first panel and the multiple caps into multiple devices, wherein each of the devices comprises at least two cavities, wherein a first cavity of the at least two cavities comprises gas of the first gas atmosphere and a second cavity of the at least two cavities comprises gas of the second gas atmosphere.

Example 17 is a device, comprising: a first cavity formed by a first cap of an airtight material bonded to a base, wherein the first cavity hermetically seals a first gas and encapsulates a first electronic component; and a second cavity formed by a second cap of an airtight material bonded to the base, wherein the second cavity hermetically seals a second gas different from the first gas and encapsulates a second electronic component.

Example 18 is a device according to Example 17, wherein the base comprises a semiconductor material and at least one of the first electronic component and the second electronic component is integrated in the semiconductor material.

Example 19 is a device according to Example 17 or 18, wherein the device comprises at least one of a microelectromechanical system, a microfluidic system, a lab-on-a-chip.

Example 20 is a device according to one of Examples 17 to 19, wherein the device comprises a photoacoustic gas sensor, the first electronic component comprises an IR emitter, the second electronic component comprises a microphone, the first gas is a protective gas, and the second gas is a reference gas.

As employed in this description, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features.

Moreover, the word "exemplary" is used herein to mean serving as an example, instance, or illustration. Any aspect or design described herein as "exemplary" is not necessarily to be construed as advantageous over other aspects or designs. Rather, use of the word "exemplary" is intended to present concepts in a concrete fashion.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

The invention claimed is:

1. A method, comprising:
   bonding a first panel of a first material to a base panel in a first gas atmosphere, wherein multiple hermetically sealed first cavities encapsulating gas of the first gas atmosphere are formed between the first panel and the base panel; and
   bonding a second panel of a second material to the base panel, wherein multiple second cavities are formed between the second panel and the base panel, the first panel and the second panel being bonded to an identical surface of the base panel.

2. The method of claim 1, wherein
   the second panel is bonded in a second gas atmosphere different from the first gas atmosphere, and
   the second cavities are hermetically sealed and encapsulate gas of the second gas atmosphere.

3. The method of claim 2, further comprising:
   singulating the bonded panels into multiple devices, wherein each of the devices comprises at least two cavities, wherein a first cavity of the at least two cavities comprises gas of the first gas atmosphere and a second cavity of the at least two cavities comprises gas of the second gas atmosphere.

4. The method of claim 1, wherein at least one of the first material and the second material is airtight.

5. The method of claim 1, wherein at least one of the first material and the second material comprises at least one of a semiconductor material, a glass material, a ceramic material.

6. The method of claim 1, wherein at least one of the first panel and the second panel comprises multiple recesses,
   is bonded to a planar surface of the base panel, and
   the cavities formed between the base panel and the at least one of the first panel and the second panel are formed by sections of the planar surface and the recesses.

7. The method of claim 1, wherein at least one of bonding the first panel and bonding the second panel comprises at least one of anodic bonding, soldering, gluing, metal-to-metal bonding.

8. The method of claim 1, further comprising:
   at least partially removing material from the first panel before bonding the second panel.

9. The method of claim 1, further comprising:
   arranging electronic components over the base panel before bonding the first panel and bonding the second panel, wherein at least one of the electronic components is arranged in at least one of the first cavities and the second cavities after bonding the first panel and bonding the second panel.

10. The method of claim 1, wherein the base panel comprises a semiconductor material and the method further comprises:
    integrating electronic components in the semiconductor material of the base panel before bonding the first panel and bonding the second panel, wherein at least one of the integrated electronic components is arranged in at least one of the first cavities and the second cavities after bonding the first panel and bonding the second panel.

11. The method of claim 1, wherein at least one of the base panel, the first panel and the second panel comprises one or more from a group consisting of: electrical through connections, conductor lines, electrical redistribution layers, optical connections, fluidic connections.

12. A method, comprising:
    bonding a first panel of a first airtight material to a surface of a base panel in a first gas atmosphere, wherein multiple hermetically sealed first cavities encapsulating gas of the first gas atmosphere are formed between the first panel and the base panel; and
    bonding multiple caps of a second airtight material to the surface of the base panel in a second gas atmosphere different from the first gas atmosphere, wherein multiple hermetically sealed second cavities encapsulating gas of the second gas atmosphere are formed between the multiple caps and the base panel, where each of the multiple hermetically sealed second cavities is formed by one of the caps.

13. The method of claim 12, further comprising:
    singulating an arrangement comprising the base panel, the first panel and the multiple caps into multiple devices, wherein each of the devices comprises at least two cavities, wherein a first cavity of the at least two cavities comprises gas of the first gas atmosphere and a second cavity of the at least two cavities comprises gas of the second gas atmosphere.

* * * * *